(12) United States Patent
Yoko

(10) Patent No.: US 8,400,805 B2
(45) Date of Patent: Mar. 19, 2013

(54) SEMICONDUCTOR DEVICE

(75) Inventor: Hideyuki Yoko, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 165 days.

(21) Appl. No.: 12/929,668

(22) Filed: Feb. 7, 2011

(65) Prior Publication Data

US 2012/0195136 A1    Aug. 2, 2012

(30) Foreign Application Priority Data

Jan. 28, 2011   (JP) ................................. 2011-016004

(51) Int. Cl.
*G11C 5/00* (2006.01)
*G11C 7/00* (2006.01)
*G11C 8/00* (2006.01)

(52) U.S. Cl. ......... 365/51; 365/52; 365/63; 365/189.05; 365/194; 365/230.03; 365/230.06; 365/233.1; 365/233.13

(58) Field of Classification Search .................... 365/51, 365/52, 63, 189.05, 194, 230.03, 230.06, 365/233.1, 233.13
See application file for complete search history.

(56) References Cited

U.S. PATENT DOCUMENTS

| 7,558,096 | B2 * | 7/2009 | Ikeda | 365/51 |
| 7,830,692 | B2 * | 11/2010 | Chung et al. | 365/51 |
| 7,894,293 | B2 * | 2/2011 | Ikeda et al. | 365/230.03 |
| 8,134,852 | B2 * | 3/2012 | Kim et al. | 365/51 |
| 8,223,524 | B2 * | 7/2012 | Chung | 365/51 |

FOREIGN PATENT DOCUMENTS

JP       2005-210106 A    8/2005

* cited by examiner

*Primary Examiner* — Trong Phan

(74) *Attorney, Agent, or Firm* — McGinn IP Law Group, PLLC

(57) ABSTRACT

A semiconductor device according to the present invention includes plural controlled chips CC0 to CC7 that hold mutually different layer information, and a control chip IF that supplies in common layer address signals A13 to A15 and a command signal ICMD to the controlled chips. Each bit that constitutes the layer address signals A13 to A15 is transmitted via at least two through silicon vias that are connected in parallel for each controlled chip out of plural first through silicon vias. Each bit that constitutes the command signal ICMD is transmitted via one corresponding through silicon via that is selected by an output switching circuit and an input switching circuit. With this configuration, the layer address signals A13 to A15 reach the controlled chips earlier than the command signal ICMD.

10 Claims, 13 Drawing Sheets

SEMICONDUCTOR DEVICE

BACKGROUND OF THE INVENTION

1. Field of the Invention

The present invention relates to a semiconductor device, and more particularly relates to a semiconductor device in which a control chip and controlled chips are connected to each other via through silicon vias.

2. Description of Related Art

A memory capacity required for semiconductor devices such as DRAM (Dynamic Random Access Memory) has been increasing every year. In recent years, to satisfy this requirement for an increased memory capacity, there has been proposed a method of stacking plural memory chips and electrically connecting these memory chips via through silicon vias on a silicon substrate (see Japanese Patent Application Laid-open No. 2005-210106).

Japanese Patent Application Laid-open No. 2005-210106 describes a semiconductor device having plural power-source through silicon vias for power source arranged to surround a periphery of a through silicon via for signal transmission. With this arrangement, electromagnetic noise that occurs along with transmission of a signal can be reduced.

According to Japanese Patent Application Laid-open No. 2005-210106, plural through silicon vias are used to supply one kind of a power, source. Similarly, using plural through silicon vias in parallel is also considered for a through silicon via for signal transmission. However, when signals are transmitted by using plural through silicon vias for all signals, a necessary number of through silicon vias becomes considerably large, and it is not efficient. On the other hand, when each signal is transmitted by using one through silicon via that is allocated to each signal in a fixed manner, a device as a whole becomes defective even when one defect occurs in a through silicon via. Therefore, as to how to transmit each signal by using through silicon vias needs to be considered in relation to operations and an area of a stacked semiconductor device.

SUMMARY

When there is a defect in a through silicon via, the following two means are considered to solve this defect.

The first means is to use plural through silicon vias in parallel for one signal. According to this means, even when one through silicon via is non-conductive, other through silicon vias can maintain a conductive state. Further, because a control that uses a switching circuit or the like is not necessary to connect the plural through silicon vias in parallel, there is an effect that a delay due to passage of a signal via the switching circuit does not occur. On the other hand, because the number of necessary through silicon vias increases, there is a disadvantage that a chip area increases.

The second means is to provide redundant through silicon vias in advance for n signal lines (n through silicon vias) instead of preparing plural through silicon vias per one signal, selectively use the n through silicon vias when there is no defect, and selectively use redundant through silicon vias when a certain through silicon via has a defect. According to this method, a defect of a product as a whole can be avoided by a relatively small area increase as compared to a case of connecting plural through silicon vias in parallel. Meanwhile, a switching circuit for selecting a through silicon via to be used is necessary, and therefore this method has a disadvantage in that a delay occurs due to passage of a signal via the switching circuit.

In a type of a semiconductor device having a control chip and plural controlled chips stacked thereon, a command signal and the like are commonly supplied to the controlled chips by using through silicon vias. Therefore, it is necessary to specify for which one of the controlled chips the command signal is effective. Specification of a controlled chip is performed by activating/inactivating a layer selection signal for each controlled chip by supplying a layer address signal to each controlled chip. That is, a command signal is taken into and performed in a controlled chip for which the layer selection signal is activated, and a command signal is received in a controlled chip in which a layer selection signal is inactivated but is not taken and not performed in the controlled chip. Therefore, in transferring a layer address signal and a command signal from a control chip, preferably, a layer address signal is configured to be transmitted relatively earlier than a command signal. The present invention has been achieved based on the above viewpoint.

In one embodiment, there is provided a semiconductor device comprising: a plurality of controlled chips each of which holds layer information different from each other, the controlled chips comparing a layer address signal with the layer information, activating a layer selection signal when the layer address signal matches the layer information, and performing operation according to a command signal when the layer selection signal is activated; and a control chip supplying the layer address signal and the command signal to the controlled chips in common, wherein the controlled chips and control chip are electrically connected to each other via a plurality of penetration electrodes, information of each bit that constitutes the layer address signal is transmitted via at least two first penetration electrodes for each of the controlled chips, and information of each bit that constitutes the command signal is transmitted via one penetration electrode that is selected by a selection signal out of a plurality of second penetration electrodes for each of the controlled chips.

According to the present invention, a layer address signal is transmitted by using plural through silicon vias, and a command signal is transmitted by using a through silicon via that is selected from the plural through silicon vias. Therefore, the transmission speed of the layer address signal becomes faster than the transmission speed of the command signal. Accordingly, the layer address signal can reach each controlled chip earlier than the command signal. Even when a defect occurs in a through silicon via, this defect does not cause a defect in the whole of a semiconductor device.

BRIEF DESCRIPTION OF THE DRAWINGS

The above features and advantages of the present invention will be more apparent from the following description of certain preferred embodiments taken in conjunction with the accompanying drawings, in which:

FIG. 9B is a circuit diagram of the command latch circuit 32a;

DETAILED DESCRIPTION OF THE EMBODIMENTS

Preferred embodiments of the present invention will be explained below in detail with reference to the accompanying drawings.

Figure 1:
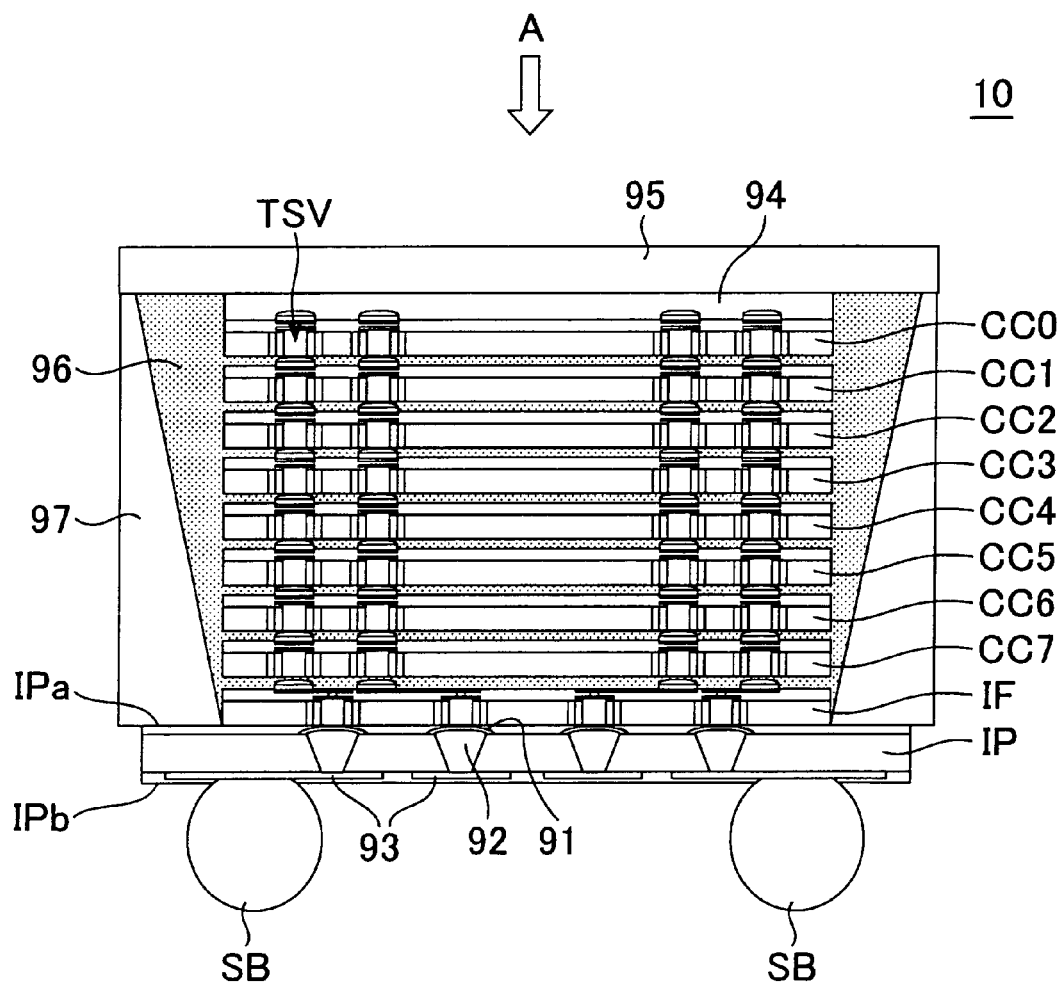
FIG. 1 is a schematic cross-sectional view illustrating the structure of a semiconductor device 10 according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory) although it is not particularly limited. The SDRAM is a well-known and common memory chip that includes the front end unit and a so-called backend unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. The interface chip IF has a front end function for communicating with the external device at a first operation frequency, and the plural core chips CC0 to CC7 have a back end function for communicating with only the interface chip IF at a second operation frequency lower than the first operation frequency. Accordingly, each of the plural core chips CC0 to CC7 includes a memory cell array that stores plural information, and a bit number of plural read data for each I/O (DQ) that are supplied from the plural core chips CC0 to CC7 to the interface chip IF in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
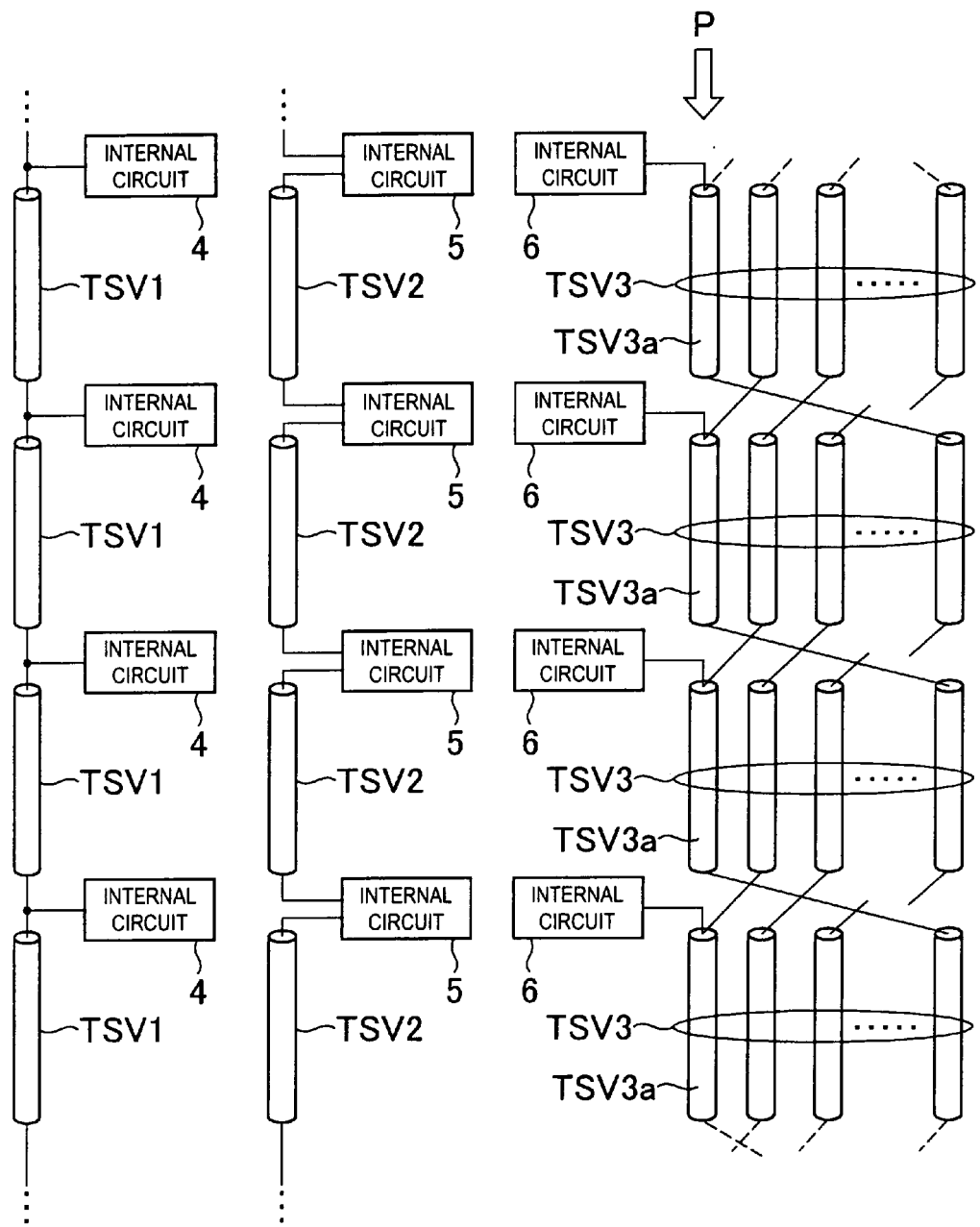
FIGS. 2A to 2C are diagram showing the various types of TSV provided in a core chip.

When most of the TSVs provided in the core chips CC0 to CC7 are two-dimensionally viewed from a lamination direction, that is, viewed from an arrow A shown in FIG. 1, the TSVs are short-circuited from the TSVs of other layers provided at the same position. That is, as shown in FIG. 2A, the vertically disposed TSV1s that are provided at the same position in plain view are short-circuited, and one wiring line is configured by the TSV1. The TSV1 that are provided in the core chips CC0 to CC7 are connected to internal circuits 4 in the core chips, respectively. Accordingly, input signals (command signal, address signal, etc.) that are supplied from the interface chip IF to the TSV1s shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Meanwhile, as shown in FIG. 2B, the a part of TSVs are not directly connected to the TSV2 of other layers provided at the same position in plain view but are connected to the TSV2 of other layers through the internal circuits 5 provided in the core chips CC0 to CC7. That is, the internal circuits that are provided in the core chips CC0 to CC7 are cascade-connected through the TSV2. This kind of TSV2 is used to sequentially transmit predetermined information to the internal circuits 5 provided in the core chips CC0 to CC7. As this information, layer address information to be described below is exemplified.

Another TSV group is short-circuited from the TSVs of other layer provided at the different position in plan view, as shown in FIG. 2C. With respect to this kind of TSV group 3, internal circuits 6 of the core chips CC0 to CC7 are connected to the TSV3a provided at the predetermined position P in plain view. Thereby, information can be selectively input to the internal circuits 6 provided in the core chips. As this information, defective chip information to be described below is exemplified.

As such, as types of the TSVs provided in the core chips CC0 to CC7, three types (TSV1 to TSV3) shown in FIGS. 2A to 2C exist. As described above, most of the TSVs are of a type shown in FIG. 2A, and an address signal, a command signal, and a clock signal are supplied from the interface chip IF to the core chips CC0 to CC7, through the TSV1 of the type shown in FIG. 2A. Read data and write data are input to and output from the interface chip IF through the TSV1 of the type shown in FIG. 2A. Meanwhile, the TSV2 and TSV3 of the types shown in FIGS. 2B and 2C are used to provide individual information to the core chips CC0 to CC7 having the same structure.

Figure 3:
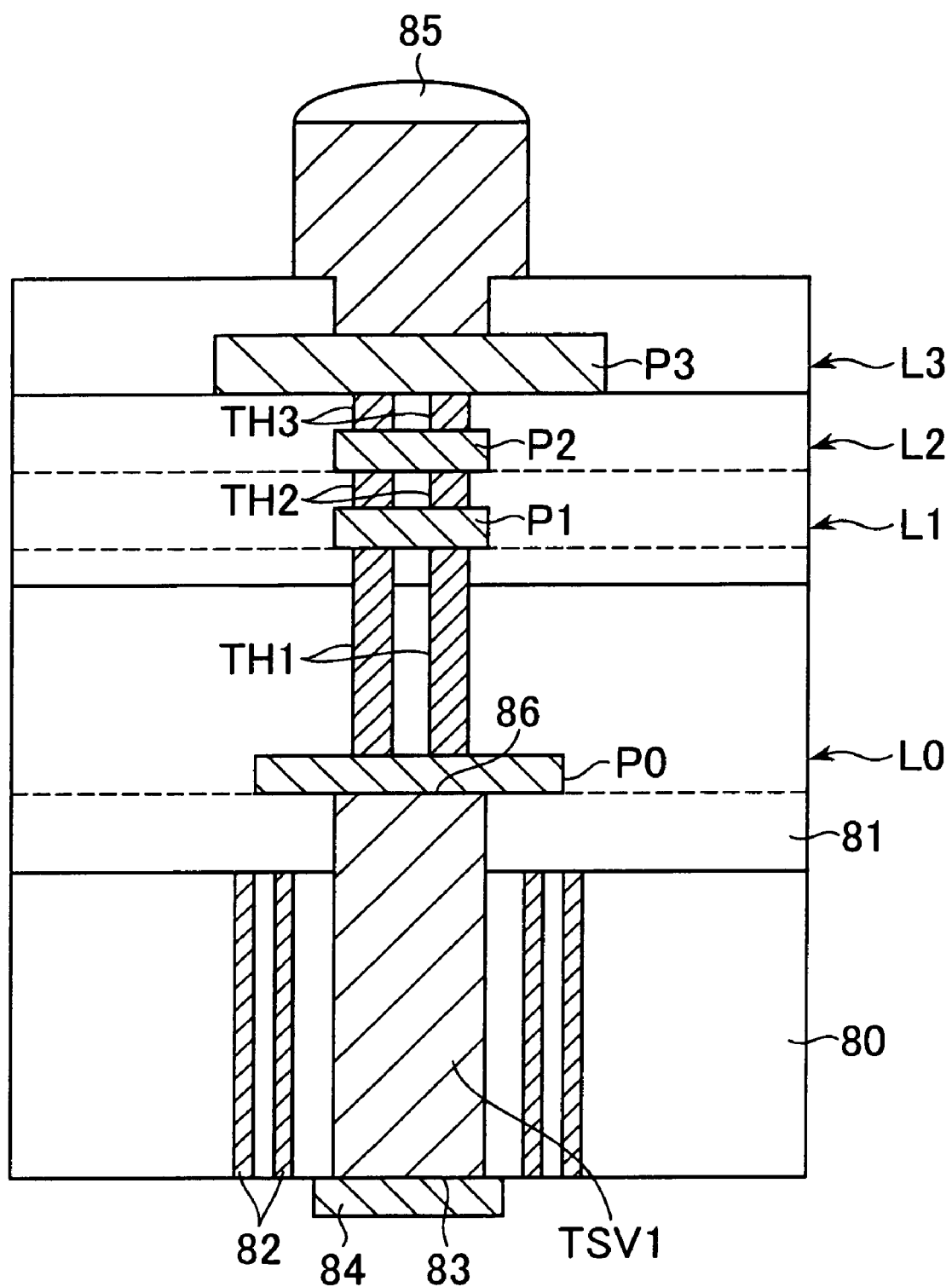
FIG. 3 is a cross-sectional view illustrating the structure of the TSV1 of the type shown in FIG. 2A.

FIG. 3 is a cross-sectional view illustrating the structure of the TSV1 of the type shown in FIG. 2A.

As shown in FIG. 3, the TSV1 is provided to penetrate a silicon substrate 80 and an interlayer insulating film 81 provided on a surface of the silicon substrate 80. Around the TSV1, an insulating ring 82 is provided. Thereby, the TSV1 and a transistor region are insulated from each other. In an example shown in FIG. 3, the insulating ring 82 is provided double. Thereby, capacitance between the TSV1 and the silicon substrate 80 is reduced.

An end 83 of the TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
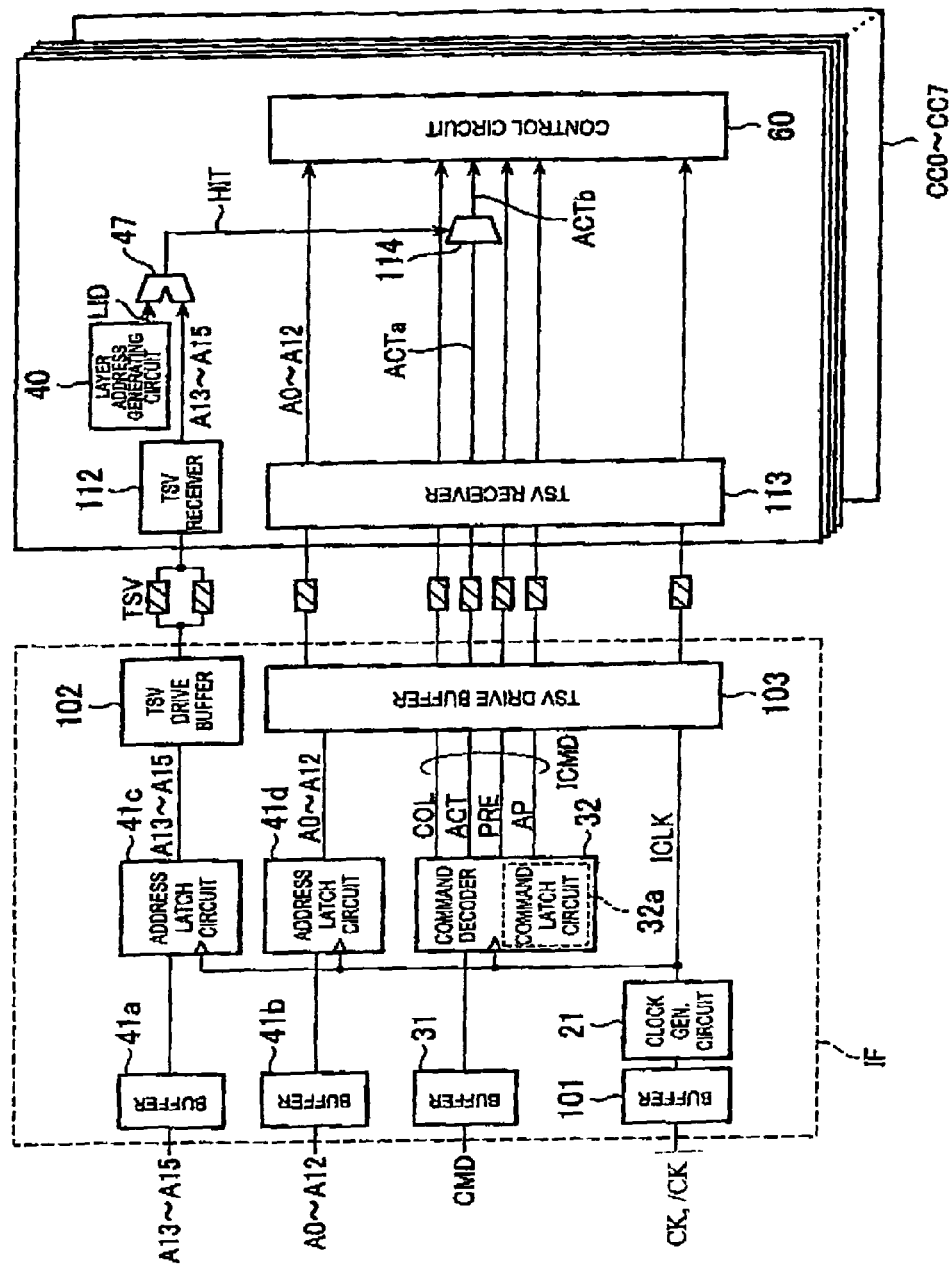
FIG. 4 is a block diagram showing a circuit configuration of main parts of the semiconductor device 10.

FIG. 4 is a block diagram showing a circuit configuration of main parts of the semiconductor device 10. FIG. 4 shows an extract of elements closely relevant to characteristics of the present invention out of elements included in the semiconductor device 10. Details of the semiconductor device 10 are described later.

As shown in FIG. 4, various signals supplied from outside of the semiconductor device 10 are all supplied to the interface chip IF, and are transferred to the core chips CC0 to CC7 via the interface chip IF. The signals supplied to the semiconductor device 10 include address signals A0 to A15, a command signal CMD, and clock signals CK, /CK. The clock signals CK, /CK are supplied to a clock generation circuit 21 via an input buffer 101. The clock generation circuit 21 generates an internal clock signal ICLK based on the clock signals CK, /CK. The internal clock signal ICLK is supplied to the interface chop IF and various circuit blocks in the core chips CC0 to CC7, and is used to control their operation timings.

Address signals A13 to A15 of high-order three bits out of the address signals A0 to A15 are used as layer address signals for selecting the core chips CC0 to CC7. The layer address signals A13 to A15 are supplied to address latch circuit 41c via an input buffer 41a. The address latch circuit 41c latches the layer address signals A13 to A15 synchronously with the internal clock signal ICLK, and supplies the latched signals to a TSV drive buffer 102. As described later, the TSV drive buffer 102 does not have a switching mechanism for avoiding a defective through silicon via TSV, and outputs an input signal to the through silicon via TSV that is allocated in a fixed manner.

Meanwhile, address signals A0 to A12 of low-order 13 bits out of the address signals A0 to A15 are used as signals for selecting memory cells in the core chips CC0 to CC7 that are selected by the layer address signals A13 to A15. The address signals A0 to A12 are supplied to an address latch circuit 41d via an input buffer 41b. The address latch circuit 41d latches the address signals A0 to A12 synchronously with the internal clock signal ICLK, and supplies the latched signals to a TSV drive buffer 103. As described later, the TSV drive buffer 103 has a switching mechanism for avoiding a defective through silicon via TSV, and outputs an input signal to a through silicon via TSV that is assigned by a switching signal.

The command signal CMD is supplied to a command decoder 32 via an input buffer 31. The command decoder 32 includes a command latch circuit 32a, and latches the command signal CMD synchronously with the internal clock signal ICLK. A latched command signal CMD is decoded in the command decoder 32, thereby generating various internal commands ICMD. The internal commands include an active command ACT, a column command COL, and a precharge command PRE. These internal commands ICMD are supplied to the TSV drive buffer 103. The internal clock signal ICLK is also supplied to the TSV drive buffer 103.

The TSV drive buffers 102 and 103 are circuits that output supplied signals to corresponding through silicon vias TSV. Signals (the layer address signals A13 to A15) that are output from the TSV drive buffer 102 are supplied to TSV receivers 112 that are provided in the core chips CC0 to CC7 via the through silicon via TSV. Similarly, signals (the address signals A0 to A12, the internal commands ICMD, the internal clock signal ICLK or the like) that are output from the TSV drive buffer 103 are supplied to TSV receivers 113 that are provided in the core chips CC0 to CC7 via the through silicon via TSV.

Various signals input to the TSV receivers 113 are input to a control circuit 60. However, out of the various signals input to the TSV receivers 113, the active command ACT is not directly supplied to the control circuit 60 but is supplied to the control circuit 60 via a latch circuit 114. The latch circuit 114 latches the active command ACT when the hit signal (a layer selection signal) HIT is activated. Therefore, when the hit signal HIT is not activated, the active command ACT is not input to the control circuit 60 even when the active command ACT is supplied. In FIG. 4, an active command that is input to the latch circuit 114 is expressed as "ACTa", and an active command that is output from the latch circuit 114 is expressed as "ACTb".

The hit signal HIT is generated by a layer-address comparing circuit 47. The layer-address comparing circuit 47 compares layer information LID0 to LID2 that is set in a layer-address generation circuit 46 with the layer address signals A13 to A15, respectively. The layer address signals A13 to A15 are supplied via the TSV receivers 112. The layer-address comparing circuit 47 activates the hit signal HIT when the corresponding layer information LID and the layer address signals A13 to A15 match each other. Although its details are described later, the layer information LID that is specific to the core chips CC0 to CC7 at an initialization time is set in the layer-address generation circuit 46. Therefore, when the layer address signals A13 to A15 are supplied in common to the core chips CC0 to CC7, the hit signal HIT is activated in only one core chip out of the core chips CC0 to CC7. Consequently, the active command ACT that is supplied in common to the core chips CC0 to CC7 becomes effective in only one of the core chips CC0 to CC7.

However, because the address signals A0 to A15 and the command signal CMD are simultaneously input to the interface chip IF, the hit signal HIT needs to be determined earlier than determination of the active command ACTa that is output from each TSV receiver 113. A most simple method for achieving this is to insert a delay circuit into a signal path of the active command ACTa. However, according to this method, a timing when the active command ACTb reaches the control circuit 60 is delayed. On the other hand, according to the present embodiment, the transmission speed in the signal path of the active command ACTa is not set low, but the transmission speed in the signal path that is relevant to generation of the hit signal HIT is set high, thereby activating the hit signal HIT at an earlier timing. This method is explained below in detail.

Figure 5:
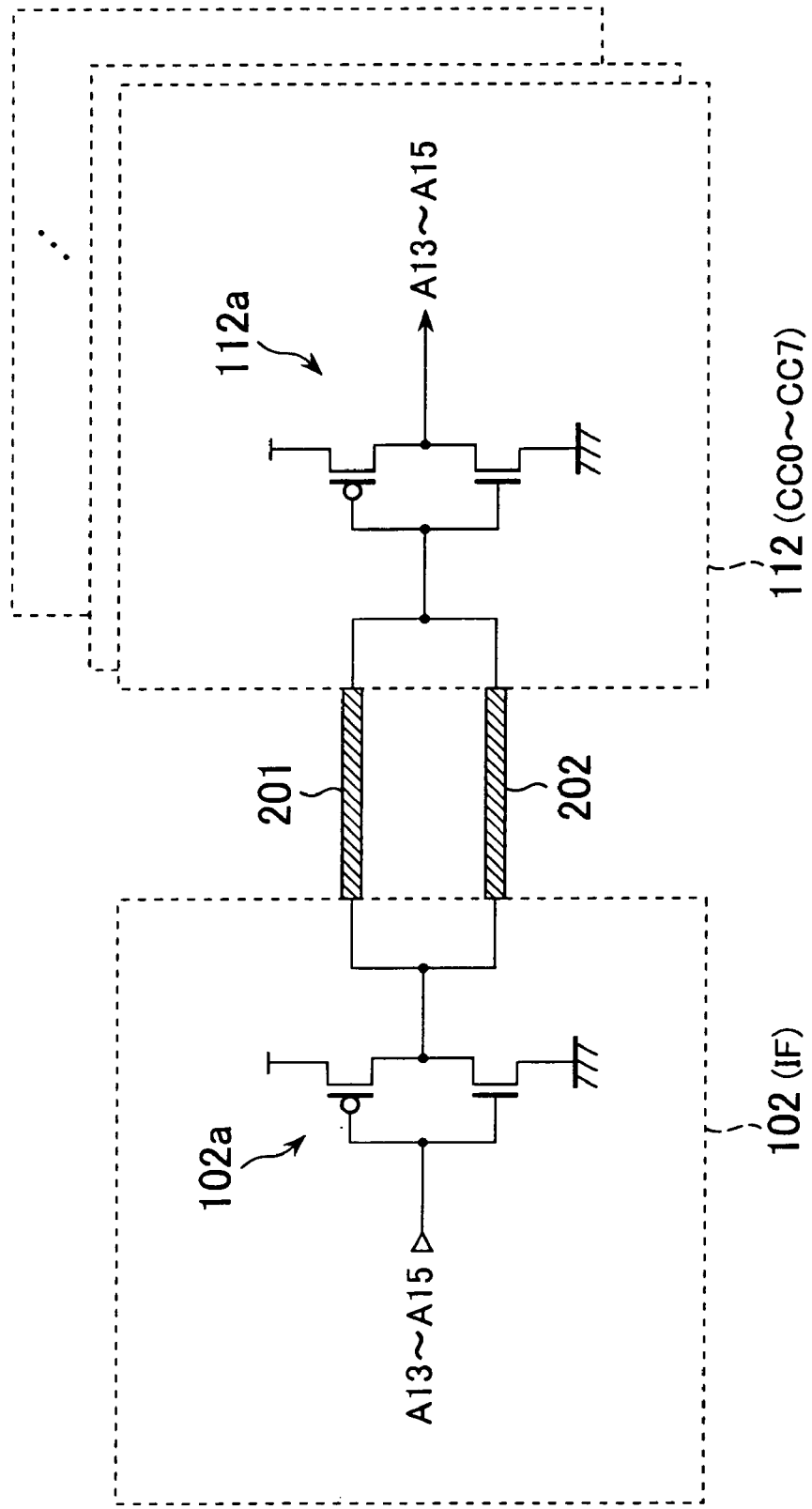
FIG. 5 is a circuit diagram showing a connection relation between the TSV drive buffer 102 and the TSV receivers 112.

FIG. 5 is a circuit diagram showing a connection relation between the TSV drive buffer 102 and the TSV receivers 112.

As shown in FIG. 5, the TSV drive buffer 102 is configured by an inverter 102a that receives corresponding bits of the layer address signals A13 to A15. An output node of the TSV drive buffer 102 is connected in common to two through silicon vias 201 and 202. Each TSV receiver 112 is configured by an inverter 112a that receives corresponding bits of the layer address signals A13 to A15. An input node of each TSV receiver 112 is connected in common to the two through silicon vias 201 and 202. With the above configuration, each bit that constitutes the layer address signals A13 to A15 is transmitted via the two through silicon vias 201 and 202 that are connected in parallel, per one core chip. Therefore, even when one of the two through silicon vias 201 and 202 becomes defective and when one of the through silicon vias TSV is in a non-conductive state because of this defective through silicon via, correct signal transmission can be performed. Delays that occur in signal transmission become only a delay due to two inverters in total that are included in the TSV drive buffer 102 and the TSV receiver 112, and a delay by a parasitic RC component held by the through silicon vias 201 and 202.

In a circuit configuration shown in FIG. 5, two through silicon vias TSV are necessary to transmit a one-bit signal, and therefore efficiency in the use of the through silicon vias TSV is not high. However, because the layer address signals A13 to A15 are in three bits in the present embodiment, it suffices to use six through silicon vias TSV. The number of through silicon vias TSV to be used in parallel is not limited to two, and three or more through silicon vias TSV can be also connected in parallel. A probability that two through silicon vias TSV become defective at the same time is considered to be sufficiently low. Therefore, it is considered sufficient to use two through silicon vias TSV per one bit as shown in FIG. 5.

Figure 6:
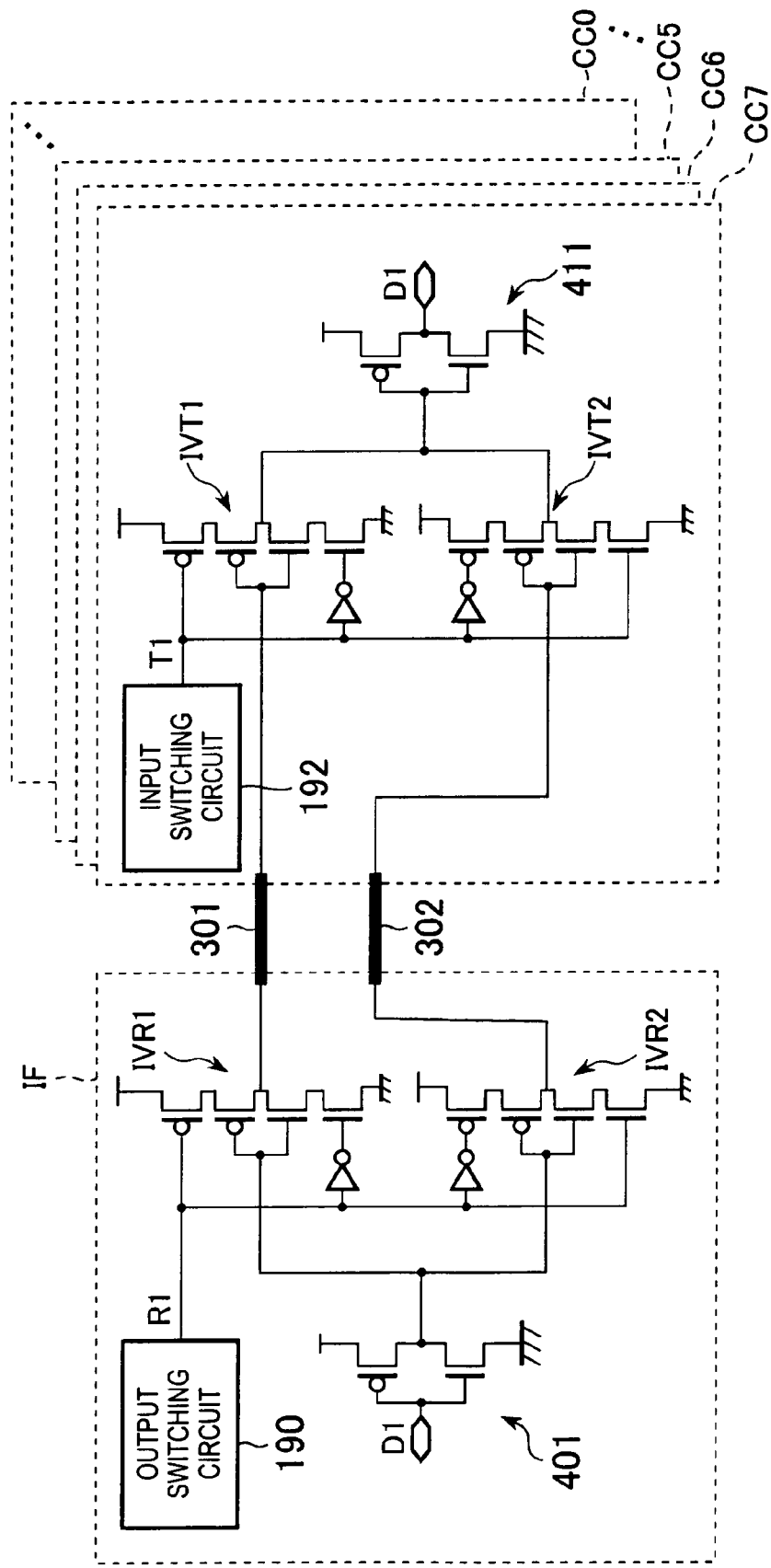
FIG. 6 is a circuit diagram showing a principle of a connection relation between the TSV drive buffer 103 and the TSV receivers 113.

FIG. 6 is a circuit diagram showing a principle of a connection relation between the TSV drive buffer 103 and the TSV receivers 113.

The TSV drive buffer 103 includes a driver circuit 401 made of an inverter, an output switching circuit 190, and two tri-state inverters IVR1 and IVR2. The inverter that constitutes the driver circuit 401 corresponds to the inverter 102a shown in FIG. 5. Each TSV receiver 113 includes a receiver circuit 411 made of an input switching circuit 192 and an inverter, and two tri-state inverters IVT1 and IVT2. The inverter that constitutes the receiver circuit 411 corresponds to the inverter 112a shown in FIG. 5.

An output node of the tri-state inverter IVR1 and an input node of the tri-state inverter IVT1 are connected to each other via a through silicon via TSV 301. An output node of the tri-state inverter IVR2 and an input node of the tri-state inverter IVT2 are connected to each other via a through silicon via TSV 302. With the above configuration, a signal D1 (the address signals A0 to A12, the internal command ICMD, the internal clock signal ICLK or the like) transmitted from the driver circuit 401 reaches the receiver circuit 411 via one of the through silicon vias 301 and 302.

The output switching circuit 190 of the interface chip IF selects one of the through silicon vias 301 and 302 for a transmission path of the signal D1. On the other hand, the input switching circuit 192 of the core chip CC7 selects one of the through silicon vias 301 and 302 for a transmission path of the signal D1. When the output switching circuit 190 selects the through silicon via 301, the input switching circuit 192 also selects the through silicon via 301. When the output switching circuit 190 selects the through silicon via 302, the input switching circuit 192 also selects the through silicon via 302.

The tri-state inverter IVR1 is inserted into a path from the driver circuit 401 to the through silicon via 301, and the tri-state inverter IVR2 is inserted into a path from the driver circuit 401 to the through silicon via 302. An output selection signal R1 of two values (H, L) is supplied from the output switching circuit 190 to a selection transistor of the tri-state inverters IVR1 and IVR2. When the output selection signal R1 is H (High), the tri-state inverter IVR1 is inactivated and the tri-state inverter IVR2 is activated. When the output selection signal R1 is L (Low), the tri-state inverter IVR1 is activated and the tri-state inverter IVR2 is inactivated. That is, the through silicon via 302 is selected when the output selection signal R1 is H, and the through silicon via 301 is selected when the output selection signal R1 is L. In this way, the data signal D1 follows the output selection signal R1, and is amplified by one of the tri-state inverters. The amplified data signal D1 passes through one of the through silicon vias, and is input to the core chip CC7.

The tri-state inverter IVT1 is inserted into a path from the through silicon via 301 to the receiver circuit 411, and the tri-state inverter IVT2 is inserted into a path from the through silicon via 302 to the receiver circuit 411. An input selection signal T1 of two values (H, L) is supplied from the input switching circuit 192 to selection transistors of the tri-state inverters IVT1 and IVT2. When the input selection signal T1 is H (High), the tri-state inverter IVT1 is inactivated, and the tri-state inverter IVT2 is activated. When the input selection signal T1 is L (Low), the tri-state inverter IVT1 is activated, and the tri-state inverter IVT2 is inactivated. That is, the through silicon via 302 is selected when the input selection signal T1 is H, and the through silicon via 301 is selected when the input selection signal R1 is L. In this way, the data signal D1 is amplified by the tri-state inverter after passing through one of the through silicon vias, and is input to the receiver circuit 411.

The output selection signal R1 and the input selection signal T1 are linked to each other. When R1=T1=L, the driver circuit 401, the tri-state inverter IVR1, the through silicon via 301, the tri-state inverter IVT1, and the receiver circuit 411 are connected to each other. At this time, both the tri-state inverter IVR2 and the tri-state inverter IVT2 become in a high-impedance state, and the through silicon via 302 cannot be used. When R1=T1=H, the driver circuit 401, the tri-state inverter IVR2, the through silicon via 302, the tri-state inverter IVT2, and the receiver circuit 411 are connected to each other, and the through silicon via 301 cannot be used. That is, the through silicon via 301 and the through silicon via 302 are exclusively selected.

In this manner, a path itself from the driver circuit 401 to the tri-state inverters IVR1 and IVR2 is not conducted or interrupted, but a transmission path is selected by activating or inactivating the tri-state inverters IVR1 and IVR2. When a switch is inserted into a path to control conduction and interruption of the path, a transmission delay due to the switch occurs. On the other hand, when activation and inactivation of a tri-state inverter is controlled like in the present embodiment, it is not necessary to insert a special delay element into a path from the driver circuit 401 to the tri-state inverter. This is because the tri-state inverter has both a function of a driver circuit (a buffer for signal amplification) and a function of a switch to control conduction and interruption of a path.

This configuration is similarly applied to a core chip CC7 side. By controlling activation and inactivation of the tri-state inverters IVT1 and IVT2, a signal delay in a path from a through silicon via to the receiver circuit 411 does not occur easily. However, when a connection relation shown in FIG. 6 is compared to a connection relation between the TSV drive buffer 102 and the TSV receiver 112 shown in FIG. 5, the tri-state inverter IVR1 or IVR2 and the tri-state inverter IVT1 or IVT2 are added in the connection shown in FIG. 6. Therefore, a delay of inverters by two stages is added. This means that even when an output timing of the layer address signals A13 to A15 that are output from the address latch circuit 41c is simultaneous with an output timing of the internal command ICMD that is output from the command decoder 32, the layer address signals A13 to A15 reach the core chips CC0 to CC7 earlier. As a result, the hit signal HIT can be activated at an earlier timing.

In the principle diagram shown in FIG. 6, although two through silicon vias TSV are allocated to one signal, actually, it is sufficient to allocate n+1 or more through silicon vias TSV to n signals per one core chip. That is, two through silicon vias TSV are not necessary to transmit a one-bit signal but it is sufficient that n+1 or more through silicon vias TSV are used to transmit an n-bit signal. Therefore, efficiency in the use of the through silicon vias TSV is high as compared to that of a system shown in FIG. 5.

Figure 7:
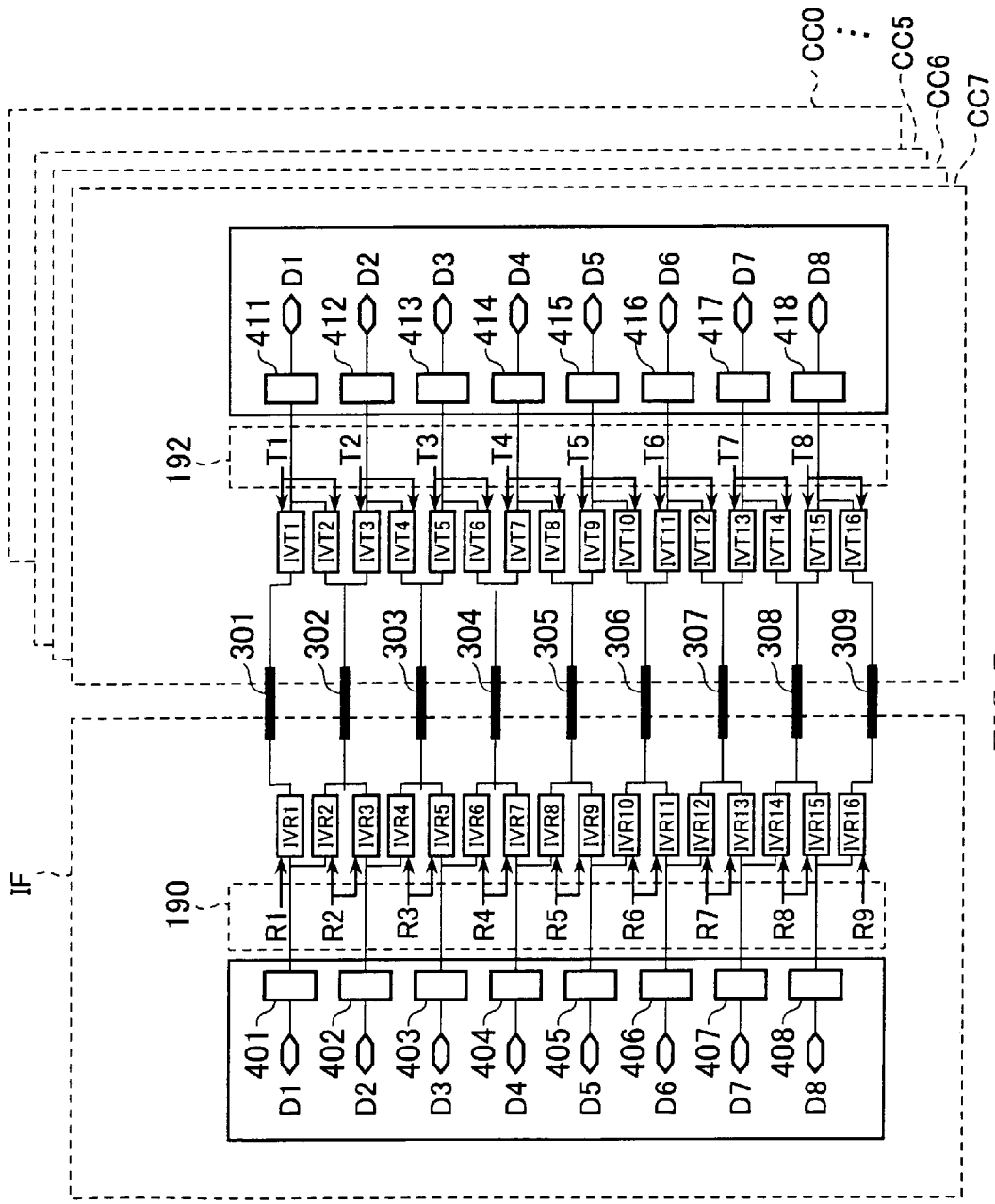
FIG. 7 is a circuit diagram showing an example that n+1 through silicon vias TSV are allocated to n signals.

FIG. 7 is a circuit diagram showing an example that n+1 through silicon vias TSV are allocated to n signals.

In the example shown in FIG. 7, eight driver circuits 401 to 408 corresponding to signals D1 to D8 are provided in the interface chip IF, and eight receiver circuits 411 to 418 corresponding to the signals D1 to D8 are provided in the core chips CC0 to CC7. Meanwhile, nine (=8+1) through silicon vias 301 to 309 are provided to connect between the driver circuits 401 to 408 and the receiver circuits 411 to 418. Out of the through silicon vias 301 to 309, the through silicon via 309 is an auxiliary through silicon via, and this through silicon via 309 is not used when there is no defect in other through silicon vias 301 to 308.

In the interface chip IF, there is provided the output switching circuit 190 that connects output ends of the driver circuits 401 to 408 to any of corresponding two through silicon vias via inverters IVR1 to IVR16. The corresponding two through silicon vias are i-th and (i+1)-th through silicon vias when tails of symbols of the driver circuits 401 to 408 are i-th (i is 1 to 8). For example, first and second through silicon vias 301 and 302 correspond to the driver circuit 401, and second and third through silicon vias 302 and 303 correspond to the driver circuit 402. Therefore, a part of the through silicon vias, that is, the through silicon vias 302 to 308 correspond to two driver circuits, respectively. However, two driver circuits are not connected to one through silicon via, and a connection to each through silicon via is performed exclusively. Which one of the corresponding two through silicon vias is to be selected is determined by output selection signals R1 to R9.

In the configuration shown in FIG. 7, the output selection signals R1 to R9 are allocated to the through silicon vias 301 to 309, respectively. When there is no defect in the through silicon via 301, the output selection signal R1 activates the tri-state inverter IVR1, and the input selection signal T1 activates the tri-state inverter IVT1. Accordingly, the driver circuit 401 and the receiver circuit 411 are connected to each other via the through silicon via 301. Similarly, when there is no defect in the through silicon vias 302 to 308, tri-state inverters of which tails of the symbols are odd numbers (IVR1, IVR3, IVR5, ..., IVR15, IVT1, IVT3, IVT5, ..., and IVT15) are activated out of the tri-state inverters IVR1 to IVR16, IVT1 to IVT16. As a result, the driver circuits 402 to 408 are connected to the receiver circuits 412 to 418 via the through silicon vias 302 to 308. The auxiliary through silicon via 309 is not used.

The above connection relation is similarly applied to the core chips CC0 to CC7. Each of the core chips CC0 to CC7 includes the input switching circuit 192. The switching circuit 192 connects input ends of the receiver circuits 411 to 418 to the through silicon vias 301 to 308 via the inverters IVT1 to IVT16.

When there is a defect in any of the through silicon vias 301 to 308, the auxiliary through silicon via 309 is used. However, a defective through silicon via is not simply substituted by the auxiliary through silicon via 309, but a connection relation between the driver circuits 401 to 408 and the receiver circuits 411 to 418 and the through silicon vias 301 to 309 is shifted around the defective through silicon via.

When a through silicon via 30x (x=1 to 8) is defective, an i-th through silicon via is selected for a driver circuit of which a tail of a symbol is first to (x−1)-th, and an (i+1)-th through silicon via is selected for a driver circuit of which a tail of a symbol is x-th to eighth.

Assume that a defect occurs in the through silicon via 306, for example. When a defect occurs in the through silicon via 306, the driver circuits 401 to 405 use the through silicon vias 301 to 305 in a normal way. That is, for the driver circuits 401 to 405, tri-state inverters (IVR1, IVR3, IVR5, IVR7, IVR9, IVT1, IVT3, IVT5, and IVT9) of which tails of symbols are odd numbers are activated as they are.

For the driver circuits 406 to 408, tri-state inverters (IVR12, IVR14, IVR16, IVT12, IVT14, and IVT16) of which tails of symbols are even numbers are activated. As a result, the driver circuit 406 and the receiver circuit 416 are connected to each other not via the through silicon via 306 but via an adjacent through silicon via 307. The driver circuits 407 and 408 are connected to the receiver circuits 417 and 418 via the through silicon vias 308 and 309, respectively. In this way, a connection relation between the driver circuits 401 to 408 and the through silicon vias 301 to 309 is shifted around a defective through silicon via.

In summary, when a defective through silicon via is 30*x*, a driver circuit 40*i* (i<x) and a receiver circuit 41*i* are connected to each other via a through silicon via 30*i*, and a driver circuit 40*i* (i≧x) and the driver circuit 41*i* are connected to each other via a through silicon via 30 (i+1).

That is, a defective through silicon via 306 is not simply substituted by the auxiliary through silicon via 309, but a connection relation between the driver circuits 401 to 408 and the receiver circuits 411 to 418 and the through silicon vias 301 to 309 is shifted around the defective through silicon via 306. In this way, an output end of a driver circuit that has a larger number is connected to a through silicon via of a larger number after substitution as well, and an output end of a receiver circuit that has a larger number is connected to a through silicon via that has a larger number. Therefore, there occurs little difference between a wiring length of a signal path before substitution and a wiring length of a signal path after substitution when i-th and (i+1)-th through silicon vias are adjacently arranged by arraying the through silicon vias 301 to 309 in this order, for example. Consequently, skew due to substitution hardly occurs, and thus the signal quality can be increased.

In the example shown in FIG. 7, although n+1 through silicon vias TSV are allocated to n signals per one core chip, more through silicon vias TSV can be also allocated.

Figure 8:
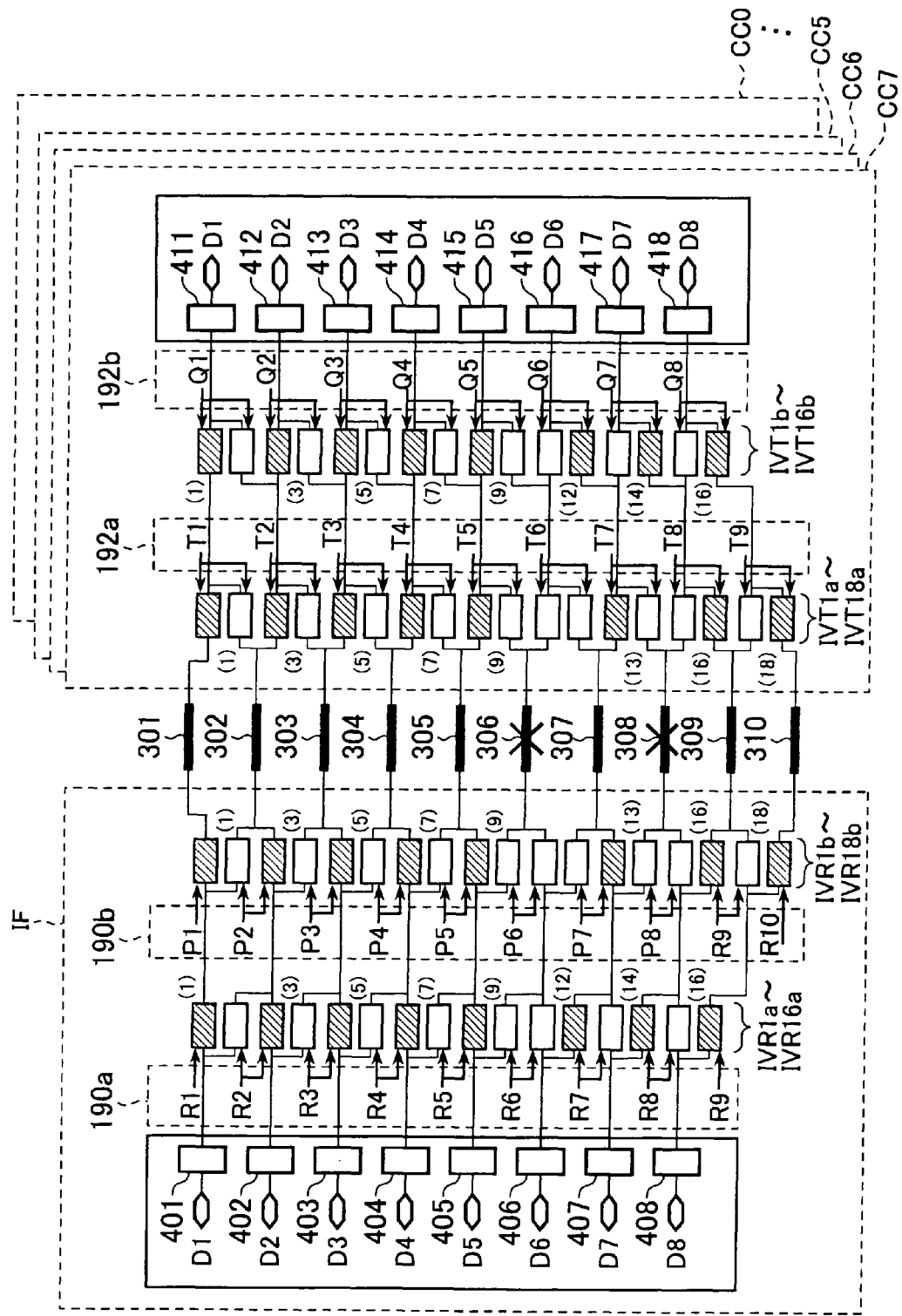
FIG. 8 is a circuit diagram showing an example that n+2 through silicon vias TSV are allocated to n signals.

FIG. 8 is a circuit diagram showing an example that n+2 through silicon vias TSV are allocated to n signals. FIG. 8 shows a case that defects are present in the through silicon vias 306 and 308. In FIG. 8, activated inverters are shown by hatched lines.

In the configuration of FIG. 8, two auxiliary through silicon vias 309 and 310 are allocated to eight through silicon vias 301 to 308. Therefore, the total number of through silicon vias is ten. Output switching circuits 190*a* and 190*b* of two stages are provided at an interface chip IF side, and input switching circuits 192*a* and 192*b* of two stages are provided at each side of the core chips CC0 to CC7. Tri-state inverters IVR1*a* to 1VR16*a* and 1VR1*b* to 1VR18*b* are configured at two stages, in the interface chip IF. The output switching circuit 190*a* controls the tri-state inverters IVR1*a* to 1VR16*a*, and the output switching circuit 190*b* controls the tri-state inverters IVR1*b* to 1VR18*b*.

Similarly, in the input switching circuit 192, inverters IVT1*a* to 1VT18*a* and inverters 1VT1*b* to 1VT16*b* are configured at two stages. In the input switching circuit 192*a*, the inverters IVT1*a* to 1VT18*a* are controlled by the selection signals T1 to T9. In the input switching circuit 192*b*, the inverters IVT1*b* to 1VT16*b* are controlled by input selection signals Q1 to Q8.

By providing the output switching circuit 190 and the input switching circuit 192 that have tri-state inverters at two stages, a connection relation between the driver circuits 401 to 408 and the receiver circuits 411 to 418 and the through silicon vias 301 to 310 can be shifted by two through silicon vias at maximum.

When one through silicon via 30*x* (x=1 to 8) is defective, an i-th through silicon via is selected for driver circuits of which tails of symbols are first to (x−1)-th, and an (i+1)-th through silicon via is selected for driver circuits of which tails of symbols are x-th to eighth. When two through silicon vias 30*x* and 30*y* (x<y) are defective, an i-th through silicon via is selected for driver circuits of which tails of symbols are first to (x−1)-th, an (i+1)-th through silicon via is selected for driver circuits of which tails of symbols are x-th to (y−2)-th, and an (i+2)-th through silicon via is selected for driver circuits of which tails of symbols are (y−1)-th to eighth.

As a specific example, when defects occur in the through silicon vias 306 and 308 (x=6, y=8), the driver circuits 401 to 405 are connected to the receiver circuits 411 to 415 via the through silicon vias 301 to 305, respectively. The driver circuit 406 is connected to the through silicon via 307 via tri-state inverters IVR12*a* and IVR13*b*. The through silicon via 307 is connected to the receiver circuit 116 via tri-state inverters IVT13*a* and IVT12*b*. That is, through silicon vias to be connected are shifted by one through silicon via.

The driver circuit 407 is connected to the through silicon via 309 via tri-state inverters IVR14*a* and IVR16*b*. The through silicon via 309 is connected to the receiver circuit 417 via tri-state inverters IVT16*a* and IVT14*b*. That is, through silicon vias to be connected are shifted by two through silicon vias. The driver circuit 408 and the receiver circuit 418 are connected to each other via the through silicon via 310.

With the configuration described above, when one defect is present in eight through silicon vias 301 to 308, connection is shifted by one through silicon via around a defective through silicon via, thereby relieving the defect. When two defects are present in nine through silicon vias 301 to 309, connection is shifted by one through silicon via first around a through silicon via of a smaller number out of defective through silicon vias, and connection is further shifted by one through silicon via around a through silicon via of a larger number.

In this manner, when n+2 through silicon vias TSV are allocated to n signals, relieving efficiency increases, and at the same time, the number of stages of logic circuits that are present between the driver circuits 401 to 408 and the receiver circuits 411 to 418 increases. Consequently, the number of signal delays also increases.

As described above, in the present embodiment, because plural through silicon vias TSV are used in parallel without using a switching circuit in a signal path for transmitting the layer address signals A13 to A15, high-speed signal transmission becomes possible while securing a redundant configuration to deal with a defect. On the other hand, because a switching circuit is used in a signal path for transmitting the active command ACT, a redundant configuration can be secured to deal with a defect while suppressing the number of through silicon vias TSV to be used. With the configuration described above, the layer address signals A13 to A15 reach the core chips CC0 to CC7 earlier than the active command ACT. Therefore, the hit signal HIT can be activated at an earlier timing.

A circuit configuration to activate the hit signal HIT at an earlier timing is explained below.

Figure 9A:
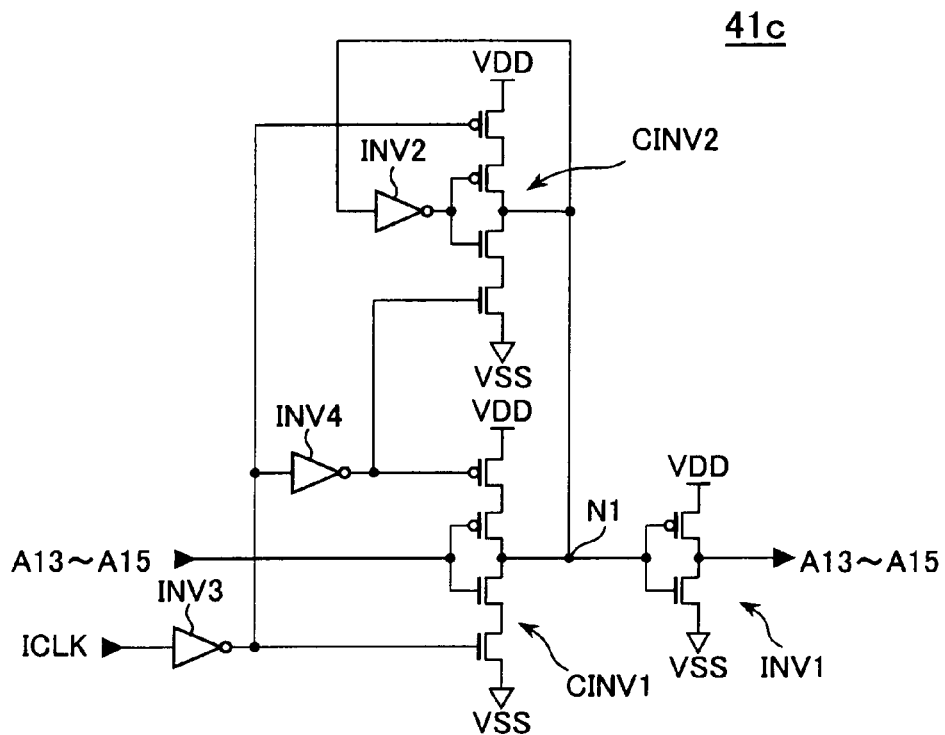
FIG. 9A is a circuit diagram of the address latch circuit 41c.
Figure 9B:
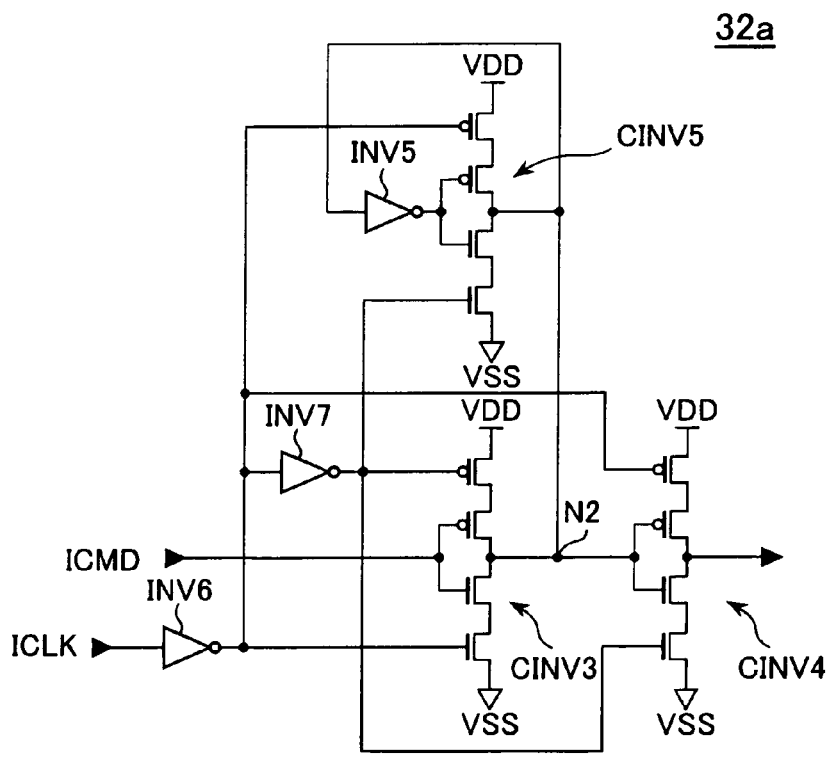

FIG. 9A is a circuit diagram of the address latch circuit 41*c*, and FIG. 9B is a circuit diagram of the command latch circuit 32*a*.

As shown in FIG. 9A, the address latch circuit 41*c* is a so-called address-through latch circuit, and outputs data that is latched synchronously with one active edge of the internal clock signal ICLK as it is.

More specifically, the address latch circuit 41*c* includes two clocked inverters CINV1 and CINV2 and four inverters INV1 to INV4, and has connected in series the clocked inverter CINV1 and the inverter INV1 that receive corresponding bits of the layer address signals A13 to A15. A connection node N1 of the clocked inverter CINV1 and the inverter INV1 is connected to an output node of the clocked inverter CINV2, and is also connected to an input node of the clocked inverter CINV2 via the inverter INV2. The internal clock signal ICLK is supplied as an operation clock to the clocked inverters CINV1 and CINV2, and the clocked inverters CINV1 and CINV2 are alternatively enabled by the inverters INV3 and INV4.

With the configuration described above, logic levels of the layer address signals A13 to A15 at a time when the internal clock signal ICLK is shifted from a low level to a high level are latched and output. However, because the inverter INV1 at a latter stage is not a clocked inverter, the layer address signals A13 to A15 are output as they are during a period when the internal clock signal ICLK is at a low level. That is, the internal clock signal ICLK shifts from a low level to a high level. Before a latch operation is performed, the layer address signals A13 to A15 are output from the address latch circuit 41c. Therefore, a time taken by the layer address signals A13 to A15 to pass through the address latch circuit 41c is shortened.

On the other hand, as shown in FIG. 9B, the command latch circuit 32a is a so-called edge-trigger latch circuit, and this circuit outputs data that is latched synchronously with one active edge of the internal clock signal ICLK, synchronously with the other active edge.

More specifically, the command latch circuit 32a includes three clocked inverters CINV3 to CINV5 and three inverters INV5 to INV7, and has connected in series the clocked inverters CINV3 and CINV4 that receive corresponding internal commands ICMD. A connection node N2 of the clocked inverters CINV3 and CINV4 is connected to an output node of the clocked inverter CINV5, and is also connected to an input node of the clocked inverter CINV5 via the inverter INV5. The internal clock signal ICLK is supplied as an operation clock to the clocked inverters CINV3 to CINV5, and the clocked inverter CINV3 and the clocked inverters CINV4 and CINV5 are alternately enabled by the inverters INV6 and INV7.

With the configuration described above, logic levels of the layer address signals A13 to A15 at a time point when the internal clock signal ICLK is shifted from a low level to a high level are latched and output. In the latch circuit shown in FIG. 9B, because the inverter CINV4 at a latter stage is also a clocked inverter, the internal command ICMD is not output during a period when the internal clock signal ICLK is at a low level, and is output in response to a shift of the internal clock signal ICLK from a low level to a high level. Therefore, a timing of outputting the internal command ICMD is defined by the internal clock signal ICLK.

As explained above, the layer address signals A13 to A15 can be output to the through silicon via TSV at an earlier timing than the internal command ICMD by using an address-through latch circuit for the address latch circuit 41c and by using an edge-trigger latch circuit for the command latch circuit 32a. Accordingly, the hit signal HIT can be activated at an earlier timing. The edge-trigger latch circuit shown in FIG. 9B can be also used for the address latch circuit 41d that latches the address signals A0 to A12.

Figure 10A:
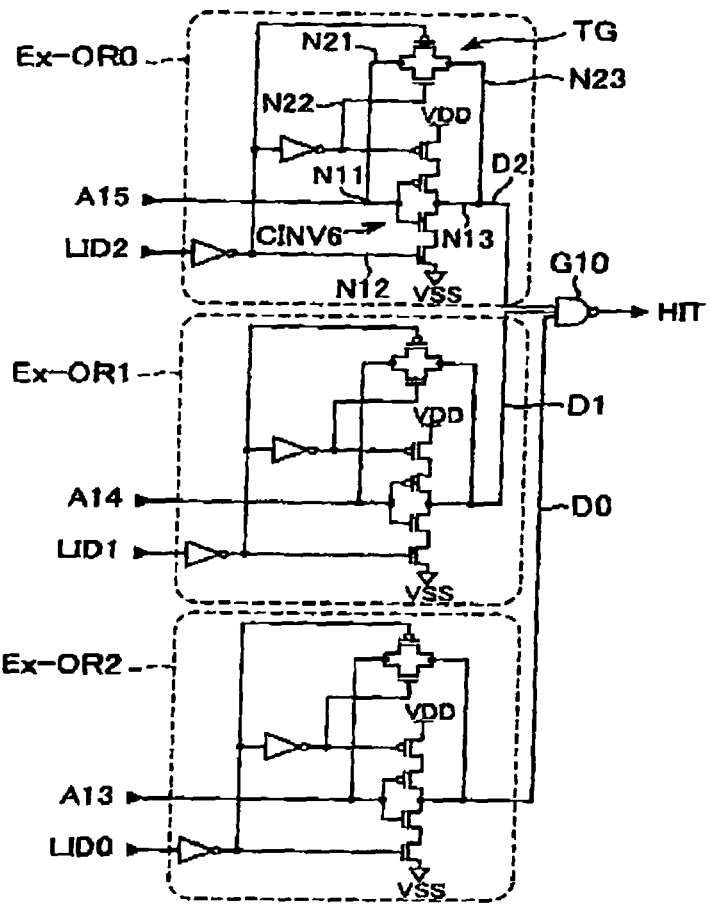
FIG. 10A is a circuit diagram showing an example of the layer-address comparing circuit 47.

FIG. 10A is a circuit diagram showing an example of the layer-address comparing circuit 47.

The layer-address comparing circuit 47 shown in FIG. 10A includes comparing circuits ExOR0 to ExOR2 that compare between bits of the layer address signals A13 to A15 and bits of the layer information LID. Each of the comparing circuits ExOR0 to ExOR2 includes a clocked inverter CINV6 that has a signal input node N11, an enable node N12, and a signal output node N13, and a transfer gate TG that has a signal input node N21, an enable node N22, and a signal output node N23. Corresponding bits of the layer address signals A13 to A15 are supplied to the signal input node N11 of the clocked inverter CINV6 and the signal input node N21 of the transfer gate TG, and a corresponding bit of the layer information LID is supplied to the enable node N12 of the clocked inverter CINV6 and the enable node N22 of the transfer gate TG. The signal output node N13 of the clocked inverter CINV6 and the signal output node N23 of the transfer gate TG are short-circuited, and are used as determination signals D0 to D2. The determination signals D0 to D2 are input to a NAND gate circuit G10, and an output of this circuit is used as the hit signal HIT.

With the above configuration, when logic levels of corresponding bits of the layer address signals A13 to A15 match logic levels of corresponding bits of the layer information LID, the comparing circuits ExOR0 to ExOR2 activate corresponding determination signals D0 to D2 at a high level, respectively. Therefore, when all bits of the layer address signals A13 to A15 match all bits of the layer information LID, the hit signal HIT is activated at a low level.

As shown in FIG. 10A, the number of logic stages necessary from when the layer address signals A13 to A15 are input to the layer-address comparing circuit 47 until when the hit signal HIT is generated is two, and thus the hit signal HIT can be activated quickly.

Opposite to an example shown in FIG. 10A, it can be configured such that corresponding bits of the layer information LID are supplied to the signal input node N11 of the clocked inverter CINV6 and the signal input node N21 of the transfer gate TG, and corresponding bits of the layer address signals A13 to A15 are supplied to the enable node N12 of the clocked inverter CINV6 and the enable node N22 of the transfer gate TG.

Figure 10B:
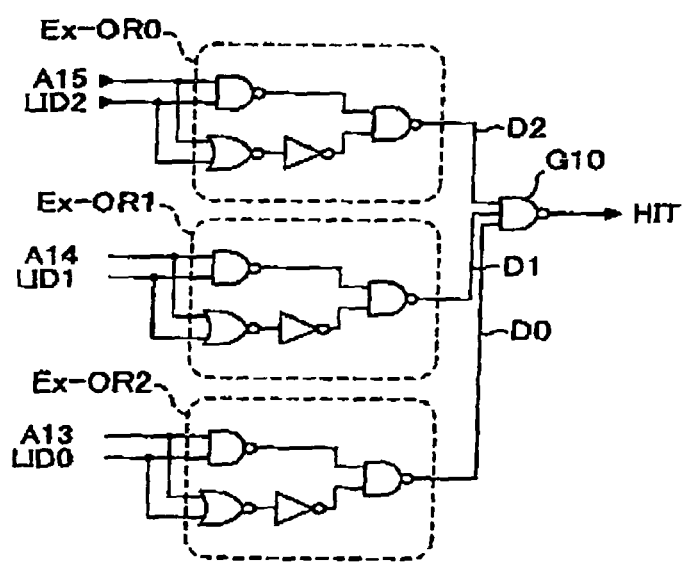
FIG. 10B is a circuit diagram showing another example of the layer-address comparing circuit 47.

FIG. 10B is a circuit diagram showing another example of the layer-address comparing circuit 47.

In the layer-address comparing circuit 47 shown in FIG. 10B, all the comparing circuits ExOR0 to ExOR2 are configured by logic gate circuits. When the comparing circuits ExOR0 to ExOR2 that have this circuit configuration are used, the number of logic stages necessary from when the layer address signals A13 to A15 are input until when the hit signal HIT is generated becomes four, and a timing of activating the hit signal HIT is slightly delayed more than a timing of activating by the layer-address comparing circuit 47 shown in FIG. 10A. Therefore, to activate the hit signal HIT at an earlier timing, it is preferable to use the layer-address comparing circuit 47 shown in FIG. 10A.

Figure 11:
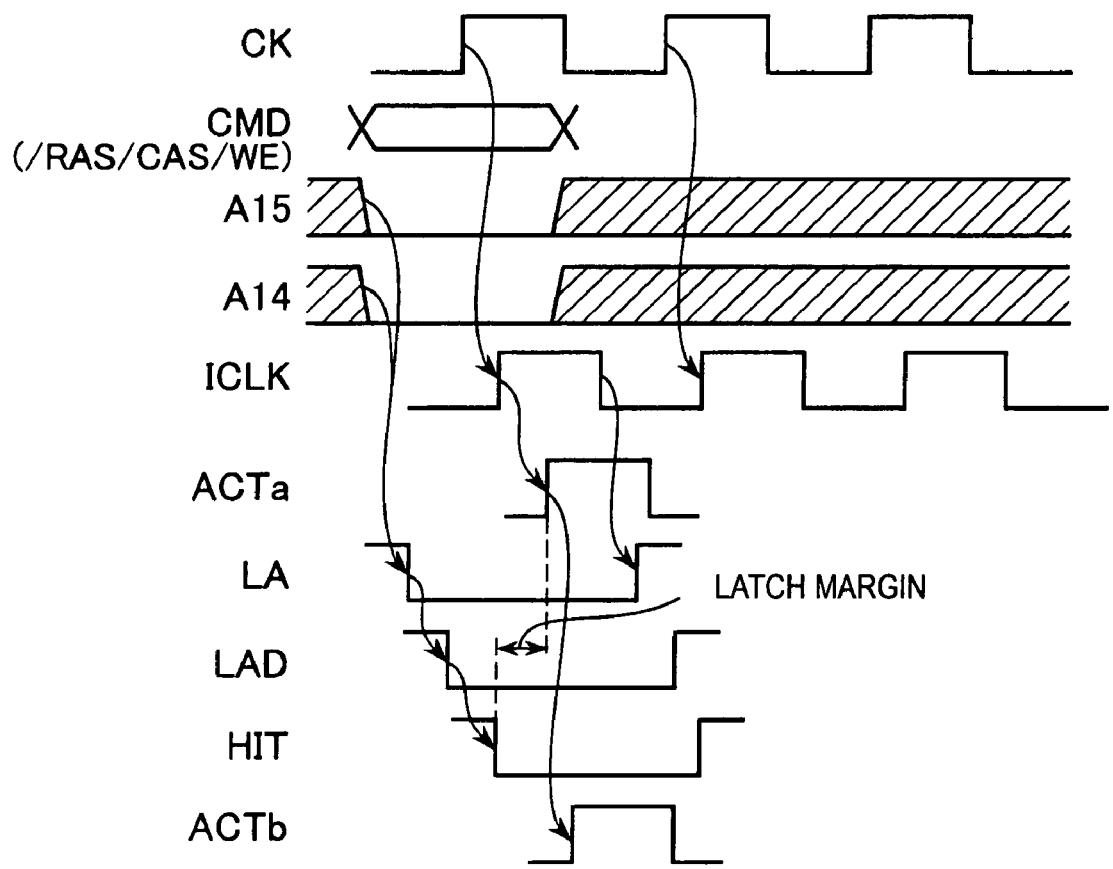
FIG. 11 is a timing diagram for explaining an effect of the semiconductor device 10.

FIG. 11 is a timing diagram for explaining an effect of the semiconductor device 10 according to the present embodiment.

In an example shown in FIG. 11, the command signal CMD is latched in response to a rising edge of the internal clock signal ICLK, and is transferred to the core chips CC0 to CC7 via the through silicon via TSV. A signal in this state is the active command ACTa shown in FIG. 11. On the other hand, regarding the layer address signals A13 to A15, these signals are output from the address latch circuit 41c immediately after the logic levels of the layer address signals A13 to A15 are determined, without waiting for a rising edge of the internal clock signal ICLK (acceleration by the address latch circuit 41c). In FIG. 11, the layer address signals A13 to A15 that are output from the address latch circuit 41c are expressed as "LA".

The layer address signals A13 to A15 that are output from the address latch circuit 41c are transferred to the core chips CC0 to CC7 via the through silicon vias TSV. As explained with reference to FIGS. 5 to 8, the transfer speed of the layer address signals A13 to A15 via the through silicon vias is faster than the transfer speed of the internal command ICMD via the through silicon vias (acceleration by parallel use of the through silicon vias TSV). In FIG. 11, the layer address signals A13 to A15 transferred to the core chips CC0 to CC7 are expressed as "LAD".

The layer address signals A13 to A15 transferred to the core chips CC0 to CC7 are compared to the layer information LID in the core chips CC0 to CC7, and the hit signal HIT is activated in matched core chips. In this case, when a circuit shown in FIG. 10A is used as the layer-address comparing circuit 47, the hit signal HIT is activated at an earlier timing than when a circuit shown in FIG. 10B is used (acceleration by the layer-address comparing circuit 47).

Accordingly, the hit signal HIT is activated at an earlier timing than that when the active command ACTa reaches the latch circuit 114. Therefore, a latch margin can be secured without a delay circuit in a signal path for transmitting the active command ACTa. Consequently, a time from when the command signal CMD is issued until when operations of the core chips CC0 to CC7 are started can be shortened. As a result, acceleration of the semiconductor device 10 can be achieved.

A circuit configuration of the semiconductor device 10 according to a preferred embodiment of the present invention is explained below in more detail.

Figure 12:
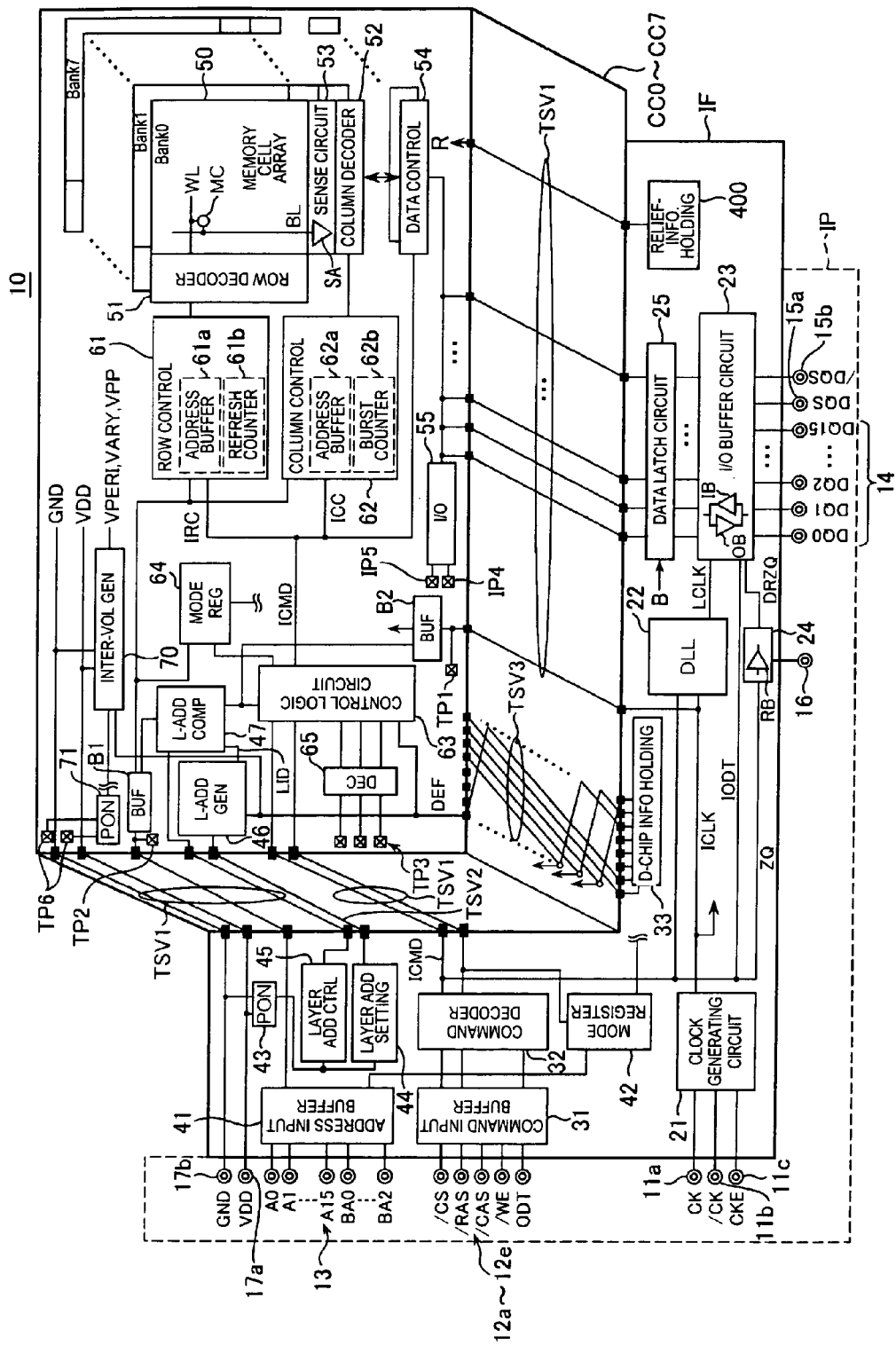
FIG. 12 is a block diagram illustrating the circuit configuration of the semiconductor device 10.

FIG. 12 is a block diagram showing a circuit configuration of the semiconductor device 10. In FIG. 12, constituent elements identical to those of FIG. 4 are denoted by like reference numerals.

As shown in FIG. 12, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the TSVs.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the TSVs.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the TSVs. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different TSVs, and partial parallel/serial conversion may be performed in the core chips CC0 to CC7 and the number of TSVs that are needed for each DQ may be reduced. For example, all of data of 64 bits for each DQ do not need to be input/output using the different TSVs, and 2-bit parallel/serial conversion may be performed in the core chips CC0 to CC7 and the number of TSVs that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the TSVs. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the TSVs.

The interface chip IF is also provided with a layer address setting circuit 44. The layer address setting circuit 44 is connected to the core chips CC0 to CC7 through the TSVs. The layer address setting circuit 44 is cascade-connected to the layer address generating circuit 46 of the core chips CC0 to CC7 using the TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the TSVs. The defective chip information holding circuit 33 is connected to the core chips CC0 to CC7 while being shifted, using the TSV3 of the type shown in FIG. 2C.

Furthermore, a relief-information holding circuit 400 is provided in the interface chip IF. The relief-information holding circuit 400 stores therein a setting of an output selection signal and an input selection signal by an anti-fuse element or the like, and when a defect is found in the through silicon via by an operation test after assembly, a tester writes a setting signal R into the relief-information holding circuit 400. The setting signal R held in the relief-information holding circuit 400 is read out when a power source is turned on, and an output selection signal and an input selection signal of the output switching circuit 190 and the input switching circuit 192 are set.

The above description is the outline of the connection relationship between the external terminals and the interface chip IF and the circuit configuration of the interface chip IF. Next, the circuit configuration of the core chips CC0 to CC7 will be described.

As shown in FIG. 12, memory cell arrays 50 that are included in the core chips CC0 to CC7 performing the back-end function are divided into eight banks, Bank0 to Bank7, respectively. A bank is a unit that can individually receive a command. That is, the individual banks can be independently and nonexclusively controlled. From the outside of the semiconductor memory device 10, each back can be independently accessed. For example, a part of the memory cell array 50 belonging to the Bank 1 and another part of the memory cell array 50 belonging to the Bank2 are controlled nonexclusively. That is, word lines WL and bit lines BL corresponding to each banks respectively are independently accessed at same period by different commands one another. For example, while the Bank1 is maintained to be active (the word lines and the bit lines are controlled to be active), the Bank2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 12, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address IRC supplied from a row control circuit 61. The row control circuit 61 includes an address buffer 61a that receives a row address IRC supplied from the interface chip IF through the TSV, and the row address IRC that is buffered by the address buffer 61*a* is supplied to the row decoder 51. The address signal that is supplied through the TSV is supplied to the row control circuit 61 through the input buffer B1. The row control circuit 61 also includes a refresh counter 61*b*. When a refresh signal is issued by a control logic circuit 63, a row address IRC that is indicated by the refresh counter 61*b* is supplied to the row decoder 51.

The column decoder 52 is controlled by a column address ICC supplied from a column control circuit 62. The column control circuit 62 includes an address buffer 62*a* that receives the column address ICC supplied from the interface chip IF through the TSV, and the column address ICC that is buffered by the address buffer 62*a* is supplied to the column decoder 52. The column control circuit 62 also includes a burst counter 62*b* that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the TSV.

The control logic circuit 63 that is a circuit corresponding to the control circuit 60 shown in FIG. 4 receives an internal command ICMD supplied from the interface chip IF through the TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the TSV and a layer address LID (chip identification information) set to the layer address generating circuit 46. When the layer address comparing circuit 47 detects a match, it activates a match signal HIT.

In the layer address generating circuit 46, unique layer addresses are set to the core chips CC0 to CC7, respectively, at initialization. A method of setting the layer addresses is as follows. First, after the semiconductor device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the TSVs of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the TSV. As the defective chip signal DEF is supplied to the individual core chips CC0 to CC7 using the TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI ($\approx$VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the TSV. The internal clock signal ICLK supplied through the TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7. The test input/output circuit 55 includes a first input IP4 and a second input IP5.

This is the entire configuration of the semiconductor device 10. Because in the semiconductor device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

In the semiconductor device 10 that has a configuration described above, a setting signal R held in the relief-information holding circuit 400 is read out when a power source is turned on, and is transferred to the output switching circuit 190 and the input switching circuit 192 in the interface chip IF and the core chips CC0 to CC7. As already explained, for the layer address signals A13 to A15, the output switching circuit 190 and the input switching circuit 192 are not used, but plural through silicon vias TSV are used in parallel. Therefore, the layer address signals A13 to A15 can be transferred at a high speed from the interface chip IF to the core chips CC0 to CC7. Consequently, the hit signal HIT can be activated at an earlier timing.

In the interface chip IF and the core chips CC0 to CC7, a defective through silicon via is not directly substituted by an auxiliary through silicon via, but the defective through silicon via is kept off by shifting a connection relation. Therefore, a wiring length difference occurs little in a signal path before and after substitution. Consequently, skew due to substitution hardly occurs, and thus the signal quality can be increased.

Further, tri-state inverters are provided at an inlet and an outlet of a through silicon via, respectively. By an amplification function of the tri-state inverters, the signal quality can be increased by compensating for signal attenuation in the through silicon via. The tri-state inverters also function as switches. As a result, it is not necessary to install a circuit delay element in a path from a driver circuit to the tri-state inverter and in a path from the tri-state inverter to a receiver circuit. Therefore, a delay of signal transmission via the through silicon via can be suppressed.

Figure 13:
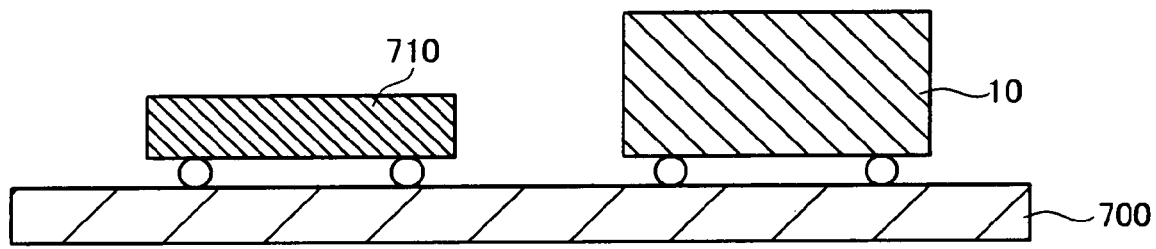
FIG. 13 is a schematic cross-sectional view showing a configuration of a data processing system that uses the semiconductor device 10.

FIG. 13 is a schematic cross-sectional view showing a configuration of a data processing system that uses the semiconductor device 10 according to the present embodiment.

The data processing system shown in FIG. 13 is configured such that the semiconductor device 10 and a memory controller 710 that controls the semiconductor device 10 are mounted on a main substrate 700. In an example shown in FIG. 13, the semiconductor device 10 is directly mounted on the main substrate 700. Alternatively, a socket can be provided on the main substrate 700, and a module substrate on which the semiconductor device 10 is mounted can be inserted into the socket. In this case, plural semiconductor devices 10 can be mounted on the module substrate.

It is apparent that the present invention is not limited to the above embodiments, but may be modified and changed without departing from the scope and spirit of the invention.

For example, in the above embodiment, a chip-stacked DRAM has been explained as an example; however, the type of stacked semiconductor chips is not particularly limited thereto, and it can be other memory devices such as an SRAM, a PRAM, an MRAM, a RRAM, or a flash memory, and also can be a logic device such as a CPU or a DSP. That is, it suffices that the semiconductor device is of a type such that a control chip and a plurality of controlled chips are stacked thereon.

What is claimed is:

1. A semiconductor device comprising:
a plurality of controlled chips each of which holds layer information different from each other, the controlled chips comparing a layer address signal with the layer information, activating a layer selection signal when the layer address signal matches the layer information, and performing operation according to a command signal when the layer selection signal is activated; and
a control chip supplying the layer address signal and the command signal to the controlled chips in common, wherein
the controlled chips and control chip are electrically connected to each other via a plurality of penetration electrodes,
information of each bit that constitutes the layer address signal is transmitted via at least two first penetration electrodes for each of the controlled chips, and
information of each bit that constitutes the command signal is transmitted via one penetration electrode that is selected by a selection signal out of a plurality of second penetration electrodes for each of the controlled chips.

2. The semiconductor device as claimed in claim 1, wherein
the control chip includes $1^{st}$ to $n^{th}$ driver circuits (n is a natural number) each of which outputs corresponding bits of the command signal,
each of the controlled chips includes $1^{st}$ to $n^{th}$ receiver circuits each of which receives corresponding bits of the command signal,
the second penetration electrodes includes $1^{st}$ to $n+m^{th}$ penetration electrodes (m is a natural number),
the control chip includes an output switching circuit that selectively connects each of the $1^{st}$ to $n^{th}$ driver circuits to different ones of the $1^{st}$ to $n+n^{th}$ penetration electrodes by connecting an $i^{th}$ driver circuit to one of $i^{th}$ to $i+m^{th}$ penetration electrodes (i is an integer of 1 to n), and
each of the controlled chips includes an input switching circuit that selectively connects each of the $1^{st}$ to $n^{th}$ receiver circuits to different ones of the $1^{st}$ to $n+m^{th}$ penetration electrodes by connecting an $i^{th}$ receiver circuit to one of $i^{th}$ to $i+m^{th}$ penetration electrodes.

3. The semiconductor device as claimed in claim 1, wherein
the control chip further includes a first latch circuit that latches the layer address signal supplied from outside and a second latch circuit that latches the command signal supplied from outside,
the first latch circuit is a through latch type that latches and outputs data synchronously with one of active edges of a clock signal, and
the second latch circuit is an edge-trigger type that latches data synchronously with the one of the active edges of the clock signal and outputs latched data synchronously with other of the active edges of the clock signal.

4. The semiconductor device as claimed in claim 1, wherein each of the controlled chips includes a plurality of comparing circuits that compare each bit of the layer address signal with each bit of the layer information, each of the comparing circuits includes a clocked inverter that has a signal input node, an enable node, and a signal output node, and a transfer gate that has a signal input node, an enable node, and a signal output node, one of a corresponding bit of the layer address signal and a corresponding bit of the layer information is supplied to the signal input node of the clocked inverter and the signal input node of the transfer gate, other one of a corresponding bit of the layer address signal and a corresponding bit of the layer information is supplied to the enable node of the clocked inverter and the enable node of the transfer gate, and the signal output node of the clocked inverter and the signal output node of the transfer gate are short-circuited.

5. The semiconductor device as claimed in claim 1, wherein the controlled chips are core chips each having memory cell array, the control chip is an interface chip that controls the core chips, and number of bits of data that are simultaneously input and output between the core chips and the interface chip is larger than number of bits of data that are simultaneously input and output between the interface chip and outside.

6. A semiconductor device comprising:

a plurality of controlled chips that hold mutually different layer information; and a control chip that supplies in common a layer address signal and a command signal to the controlled chips, wherein each of the controlled chips includes a layer-address comparing circuit that activates a layer selection signal when the layer address signal and the layer information match each other, a latch circuit that takes in the command signal when the layer selection signal is activated, a control circuit that operates in response to the command signal that is taken into the latch circuit, a plurality of first penetration electrodes provided through a corresponding chip and transmit the layer address signal, a plurality of second penetration electrodes provided through a corresponding chip and transmit the command signal, and an input switching circuit that selects penetration electrodes to be used out of the second penetration electrodes, the control chip includes an output switching circuit that selects penetration electrodes to be used out of the second penetration electrodes, each bit that constitutes the layer address signal is transmitted via at least two penetration electrodes that are connected in parallel for each of the controlled chips out of the first penetration electrodes, and each bit that constitutes the command signal is transmitted via one corresponding penetration electrode that is selected by the output switching circuit and the input switching circuit.

7. A semiconductor device comprising:

a first controlled chip holding first layer address information defined by first layer address bits, and including a plurality of first penetration electrodes;

a second controlled chip stacked with the first controlled chip, the second controlled chip holding second layer address information defined by second layer address bits, the second layer address information and the second layer address bits being different from the first layer address information and the first layer address bits, respectively, the second controlled chip including a plurality of second penetration electrodes each electrically coupled with a corresponding one of the first penetration electrodes; and a control chip stacked with the second controlled chip, including a plurality of third penetration electrodes each electrically coupled with a corresponding one of the second penetration electrodes and a corresponding one of the first penetration electrodes, supplying third layer address information defined by third layer address bits to the first and second controlled chips, selecting the first controlled chip when the third layer address information matches the first address information and the second controlled chip when the third layer address information matches the second layer address information, and each of the third layer address bits being supplied to the first and second controlled chips via at least two of the third penetration electrodes.

8. The semiconductor device as claimed in claim 7, wherein the at least two of the third penetration electrodes are electrically coupled to corresponding at least two of the second penetration electrodes and corresponding at least two of the first penetration electrodes.

9. The semiconductor device as claimed in claim 7, wherein the control chip further supplies command information defined by command bits to the first and second controlled chips to control the selected one of the first and second controlled chips and each of the command bits is supplied to the first and second controlled chips via a corresponding one of the third penetration electrodes.

10. The semiconductor device as claimed in claim 9, wherein the control chip further includes a switching circuit to select the corresponding ones of the third penetration electrodes in specified number of the third penetration electrodes.

* * * * *